(12) United States Patent
Katayama et al.

(10) Patent No.: US 6,504,755 B1
(45) Date of Patent: Jan. 7, 2003

(54) SEMICONDUCTOR MEMORY DEVICE

(75) Inventors: Kozo Katayama, Kokubunji (JP); Dai Hisamoto, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/959,821
(22) PCT Filed: May 14, 1999
(86) PCT No.: PCT/JP99/02503
§ 371 (c)(1),
(2), (4) Date: Nov. 8, 2001
(87) PCT Pub. No.: WO00/70675
PCT Pub. Date: Nov. 23, 2000

(51) Int. Cl.$^7$ .............................. G11C 16/04
(52) U.S. Cl. .................. 365/185.15; 365/174; 365/182
(58) Field of Search ............... 365/185.15; 357/235; 438/261, 286; 257/316, 28, 321, 351

(56) References Cited

U.S. PATENT DOCUMENTS

| | | | | |
|---|---|---|---|---|
| 4,630,086 A | * | 12/1986 | Sato et al. ............ | 357/23.5 |
| 5,851,881 A | * | 12/1998 | Lin et al. ................ | 438/261 |
| 5,930,631 A | * | 7/1999 | Wang et al. ............ | 438/286 |
| 6,215,148 B1 | * | 4/2001 | Eitan ..................... | 257/316 |

OTHER PUBLICATIONS

US patent application publication US 2001/002054 A1 by Sunami et al.*
US patent application publication US 2002/0001900 A1 by Scheller et al.*
Kazuo Nakazato, Pawel J.A. Piotrowicz, David G. Hasko, Haroon Ahmed and Kiyoo Itoh, "PLED—Planar Localised Electron Devices", 1997 IEEE, Session 7.7.1, pp. 179–182.
Shin–ichi Minami and Yoshiaki Kamigaki, A Novel MONOS Nonvolatile Memory Device Ensuring 10–Year Data Retention after $10^7$ Erase/Write Cycles, 1993 IEEE, vol. 40, No. 11, pp. 2011–2017.

* cited by examiner

Primary Examiner—David Nelms
Assistant Examiner—Thinh Nguyen

(57) ABSTRACT

A semiconductor memory device is constituted by forming two types of insulation films on the channel of an MOS transistor on which a vertical type another MOS transistor using the control gate of the MOS transistor as a substrate is stacked. Thus, a non-volatile semiconductor memory device small in size, having high reliability, high density, excellent fatigue and a random access function can be provided.

8 Claims, 6 Drawing Sheets

FIG. 3
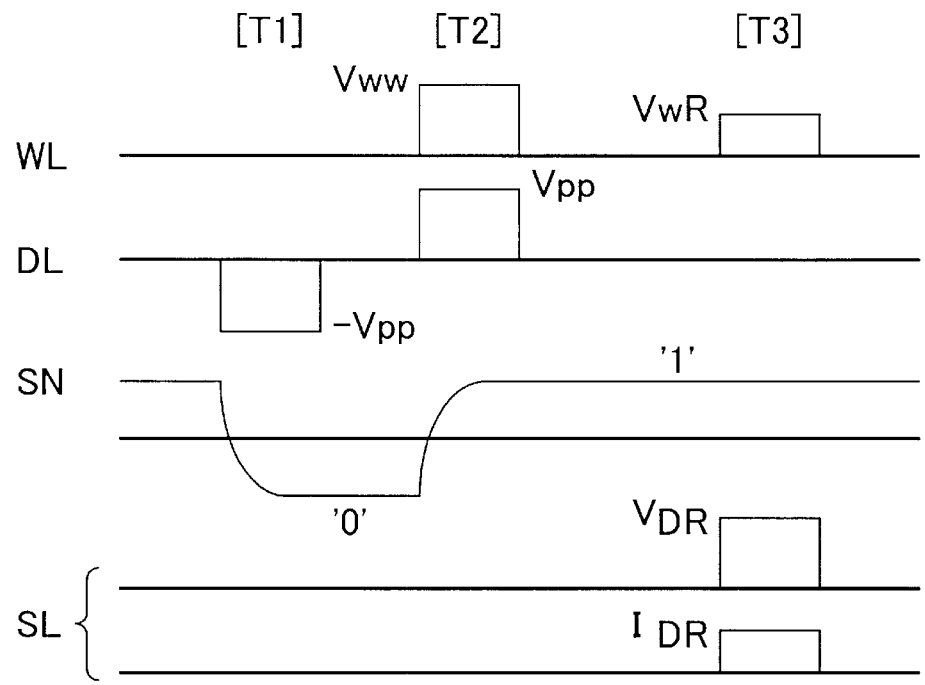
FIG. 4A    FIG. 4B
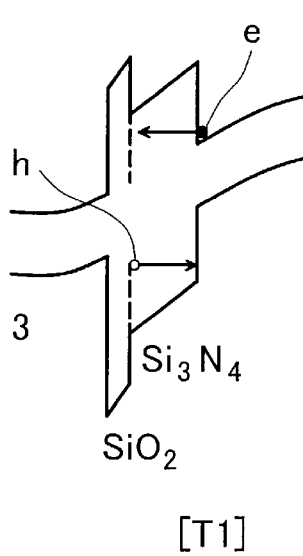
[T1]
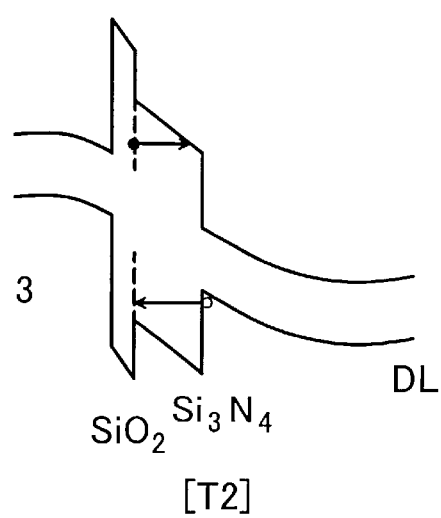
[T2]

I-I CROSS SECTION

II-II CROSS SECTION

FIG. 11
FIG. 11A
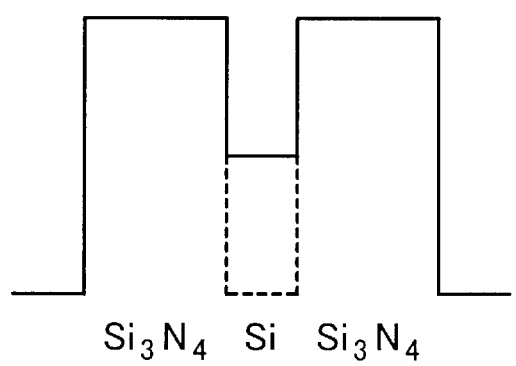
Si₃N₄   Si   Si₃N₄
LOW ELECTRIC
FIELD APPLIED
FIG. 11B
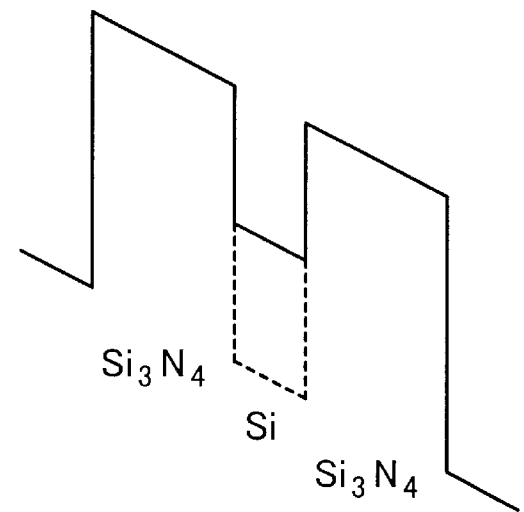
Si₃N₄
　　　Si
　　　　Si₃N₄
HIGH ELECTRIC
FIELD APPLIED

SEMICONDUCTOR MEMORY DEVICE

TECHNICAL FIELD

The present invention concerns a high density, high speed semiconductor memory suitable to application in a case of constituting a semiconductor memory device, particularly, a large scaled integrated circuit.

BACKGROUND ART

Heretofore, DRAMs (Dynamic Random Access Memories) have been often used in view of their large capacity as general purpose large capacity memory devices (large capacity memories). However, in DRAM, since it is necessary to store information in the capacitor in the memory cell and detect and amplify minute signals formed from the stored charges, the operation tends to be unstable. In order to prevent erroneous operation caused by various noises formed in the memory chip and noises intruding from natural world such as noises or α-rays, it is necessary to ensure the amount of signal to a predetermined value or more and this imposes a limit for the reduction of the capacitance of the capacitor. Accordingly, a high density, can not be attained by merely reducing the size of the existent memory cell. Accordingly, developments for memory cells capable of storing information with a smaller amount of charges have been conducted vigorously.

As an example, there is a PLED (Planer Localized Electron Devices) memory cell as described in 1997 "International Electron Devices Meeting Technical Digest" in the proceedings of American Academic Conference, Session 7.7.1, pp. 179–182.

The PLED memory cell has a feature in providing a floating gate and a vertical transistor laminated on a memory cell, in which information is stored in the floating gate and control is conducted by the vertical transistor. With such a structure, a gain cell structure having a signal amplifying effect in the cell itself is formed and information can be kept with a small amount of charges and, in addition, a small cell size is attained irrespective of the two transistor system. However, it is necessary to dispose a tunneling multi-layer with a large number of lamination on the floating gate and it involves a problem of requiring many process steps and increasing the cost for the production.

On the other hand, another category for a general purpose high density memory device is a non-volatile memory device and an example thereof is an MNOS (Metal-Nitride-Oxide-Semiconductor) type EEPROM (Electrically Erasable Programmable Read Only Memory). Since the memory device of this type has a non-volatility and, at the same time, a gain structure is formed, it can keep the information with a small amount of charges. However, it requires a high voltage for writing the information into the memory cell, and the writing time is as slow as about 1 ms, so that it can not be used as a high speed memory device. In addition, the rewriting cycles are restricted by degradation of the dielectric film to about $10^5$ to $10^6$ cycles.

In an MONOS (Metal-Oxide-Nitride-Oxide-Semiconductor) structure improved for the MNOS type (refer, for example, to "IEEE Transaction on Electron Devices", US Magazine, (November 1993), vol. 40, No. 11, pp. 2011 to 2017, fatigue of $10^7$ cycles is attained. However, the MONOS type EEPROM has a two transistors per one cell constitution in order to provide a random access function, so that the cell size is large and it is difficult to attain a higher density memory device than usual.

DISCLOSURE OF INVENTION

An object of the invention is to solve the foregoing problems in the prior art and provide a small-sized highly reliable, high density, non-volatile semiconductor memory device having excellent fatigue and having a random access function.

The MNOS type memory device described above has a silicon oxide layer and a silicon nitride layer formed on the layer for storing information. An information storing portion is a storage node formed in a silicon nitride layer or at a boundary where both layers are in contact with each other and injection and discharge of carriers into and out of the storage node are conducted exclusively from the channel to the silicon oxide layer of the memory cell transistor. Accordingly, the fatigue is determined by the durability of the silicon oxide layer. However, the silicon oxide layer has a nature of being liable to be deteriorated by the application of a high electric field along with injection and discharge of the carriers and the memory durability is determined thereby. The silicon oxide layer is disposed in contact with the channel, because the silicoin oxide layer has a high barrier height required in the storage operation.

On the contrary, the silicon nitride layer has a property more excellent in the durability than the silicon oxide layer. However, the MNOS type memory has a structure not utilizing the characteristics of the silicon nitride layer.

On the other hand, in the PLED type memory device as described above, carriers are injected and discharged into and out of the floating gate from the tunneling multi-layer and control for writing and erasure is conducted by the control gate of the vertical transistor formed above the memory cell transistor. That is, the PLED type adopts not to inject and discharge of carriers upwardly on the side of the channel of the memory cell transistor but injection and discharge of the carriers in the downward direction from the layer thereabove.

When injection and discharge of the carriers from above is applied to the MNOS type, the silicon nitride layer can be utilized instead of the silicon oxide layer as the intermediate layer for charging and discharge of the carriers. In addition, since the vertical transistor required for this purpose has a structure stacked on the memory cell transistor as described above, the cell size increases only slightly. Further, since it has a transistor for control, it can provide a random access function.

This invention has been achieved based on the novel concept of applying injection and discharge of the carriers from above to the MNOS type having non-volatility. That is, in order to attain the foregoing object, the semiconductor memory device according to this invention has a feature in forming two kinds of dielectric films on the channel of a MOS (Metal Oxide Semiconductor) and laminating another vertical MOS transistor using the control gate of the above-mentioned transistor as a substrate to a portion thereabove.

BRIEF DESCRIPTION OF THE DRAWINGS

FIG. 3 is an operation time chart for explaining the operation of the first example;

FIGS. 4A and 4B are energy band diagrams for explaining the operation principle of the first example;

FIGS. 11A and 11B are energy band diagrams for explaining the operation principle of the third example.

BEST MODE FOR CARRYING OUT THE INVENTION

Now, a semiconductor memory device according to this invention is to be explained more specifically by way of several examples with reference to the drawings. Identical notations in FIG. 1 to FIG. 10 represent identical or similar components.

Example 1

Figure 1:
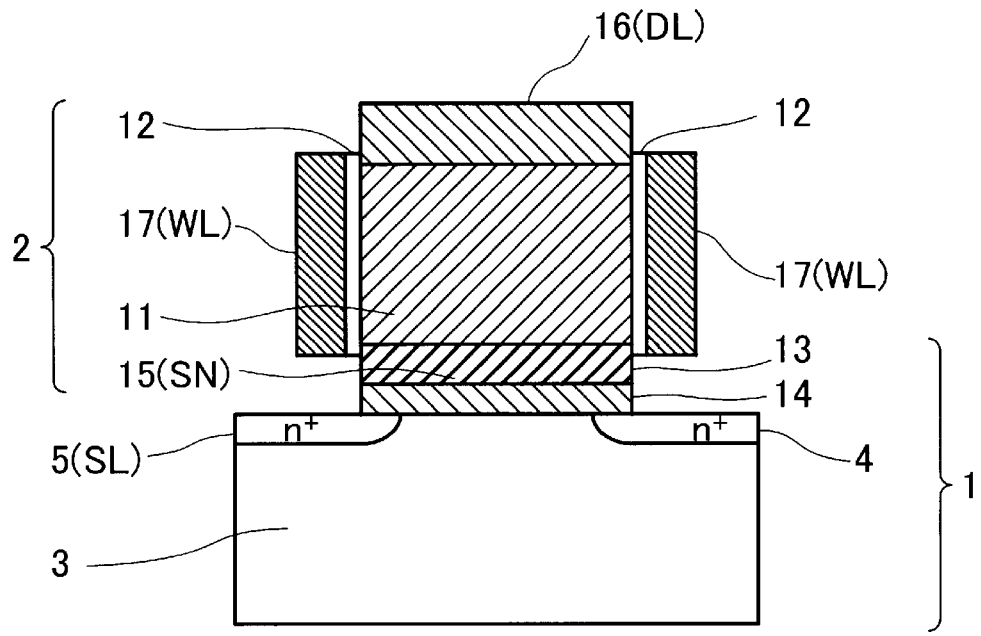
FIG. 1 is a cross sectional view of a memory cell for explaining a first example of a semiconductor memory device according to this invention.

At first, a memory cell of a semiconductor memory device of this example is to be explained based on FIG. 1. In FIG. 1, 1 denotes an MOS transistor forming a memory cell, 2 denotes a vertical type MOS transistor formed by stacking on the MOS transistor 1, 3 denotes an Si substrate for the MOS transistor 1, 4 denotes an $n^+$ diffusion layer on one side as a source formed in an upper portion of the Si substrate 3, 5 denotes another $n^+$ diffusion layer on the other side as a drain formed in the upper portion of the Si substrate 3, 14 denotes a gate insulation film comprising a silicon oxide ($SiO_2$) film of the MOS transistor 1, 13 denotes a tunneling insulation film comprising a silicon nitride ($Si_3N_4$) film deposited on the gate insulation film 14, 11 denotes a control gate comprising polysilicon deposited on the tunneling insulation film 13, 16 denotes an electrode comprising polysilicon deposited on the control gate 11 and highly doped to a P-type or N-type, 12 denotes an insulation film comprising a silicon oxide ($SiO_2$) film formed on the lateral side of the control gate 11, and 17 denotes a control gate comprising highly doped polysilicon.

The vertical MOS transistor 2 is formed as an MOS transistor using the control gate 11 as a substrate, the insulation film 12 as a gate insulation film and the electrode 16 as a diffusion layer, to which the control gate 17 is added and which is ON-OFF controlled by the control gate 17. The control gate 11 is hereinafter referred to as a control gate/substrate 11.

When a voltage is applied to the control gate 17, an inversion layer is formed at the interface between the control gate/substrate 11 and the insulation film 12 and a conductive layer is formed between the electrode 16 and the tunneling insulation film 13. When a high electric field is applied to the tunneling insulation film 13, charges tunnel from the control gate/substrate 11 to the tunneling insulation film 13, that is, a channel current flows in the vertical direction and the charges are trapped in charge traps in the tunneling insulation film 13 or at the interface between the gate insulation film 14 and the tunneling insulation film 13. The charge trap or the interface that traps the charges forms a storage node. In FIG. 1, 15 denotes the storage node (SN).

As described above in this invention, since charges are not injected from the channel of the MOS transistor 1 as in the existent non-volatile memories such as MNOS memories, degradation of the gate insulation film 14 is decreased and a non-volatile memory of higher reliability than usual can be attained.

Further, since the control gate 17 is electrostatically coupled not only with the control gate/substrate 11 but also with the storage node 15, the conduction state of the MOS transistor 1 is also controlled by applying an appropriate voltage to the control gate 17.

The memory cells as described above are formed into an array to constitute a semiconductor memory device having a random access function. In this case, the electrode 16 is used as a write data line (DL), the control gate 17 is used as a word line (WL) and the drain 5 is used as the read data line (SL).

Figure 2:
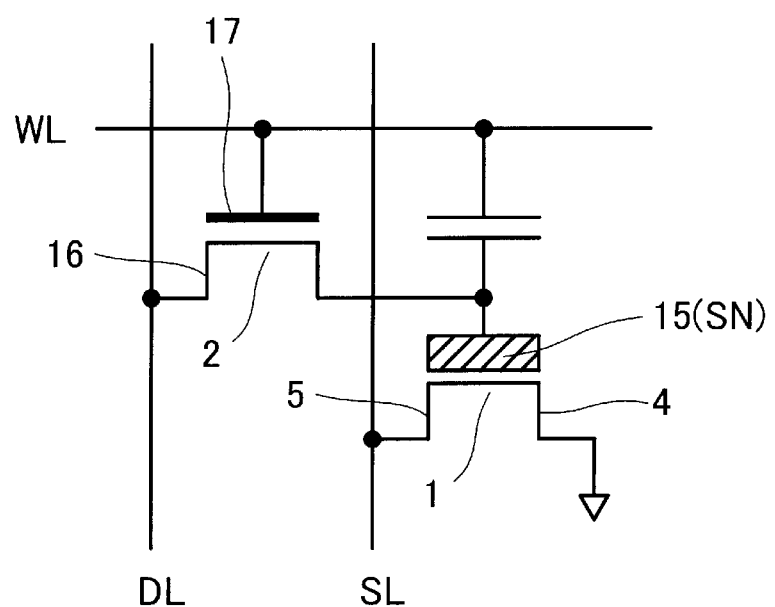
FIG. 2 is a circuit diagram of a memory cell for explaining the first example.

The memory cell described above constituting the semiconductor memory device is represented by an equivalent circuit as shown in FIG. 2. Erasing, writing and reading operations of the memory cell are to be explained with reference to FIG. 3, in a case where the MOS transistors 1 and 2 are of the N-channel type.

(1) Data Erasing

Upon erasing period T1, a negative voltage—Vpp is applied to the write data line DL in a state of keeping the voltage to the word line WL and the voltage to the-read data line SL of the MOS transistor 1 to zero. The source 4 is grounded to the earth. The energy band diagram for the path from the Si substrate 3 to the control gate/substrate 11 and the data line DL is as shown in FIG. 4A. Upon erasing period T1, electrons e of the conduction band CB flow from the control gate/substrate 11 to the $SiO_2$–$Si_3N_4$ interface and holes h flow to the valance electron band VB in which the storage node 15 is negatively charged to a "0" state.

(2) Data Writing

Upon writing period T2, a positive voltage Vpp is applied to the write data line DL in a state of applying a voltage Vww higher than the threshold voltage of the MOS transistor 2 to the word line WL and keeping the voltage to the read data line SL to zero. Upon writing T2, as in FIG. 4B, tunneling of electrons e and holes h are caused in the direction opposite to that upon data erasing in which the storage node 15 is positively charged to a "1" state.

(3) Data Reading

Upon reading period T3, while keeping the voltage for the write data line DL to zero, a voltage VwR near the threshold voltage of the MOS transistor 1 is applied to the word line WL and a positive voltage $V_{DR}$ is applied to the read data line SL. In a state where the storage node 15 is erased to "0", since negative charges are stored, the threshold voltage of the MOS transistor is high and current does not flow to the read data line SL. On the other hand, in a case where the storage node 15 is written to "1" state, since positive charges are stored, the threshold voltage of the MOS transistor 1 is low, current IDR flows to the data read line SL and data stored in the node 15 can be read. As described above, a reading operation is conducted while controlling the conduction state of the MOS transistor 1 by applying a voltage near the threshold voltage to the control gate 17.

Figure 5:
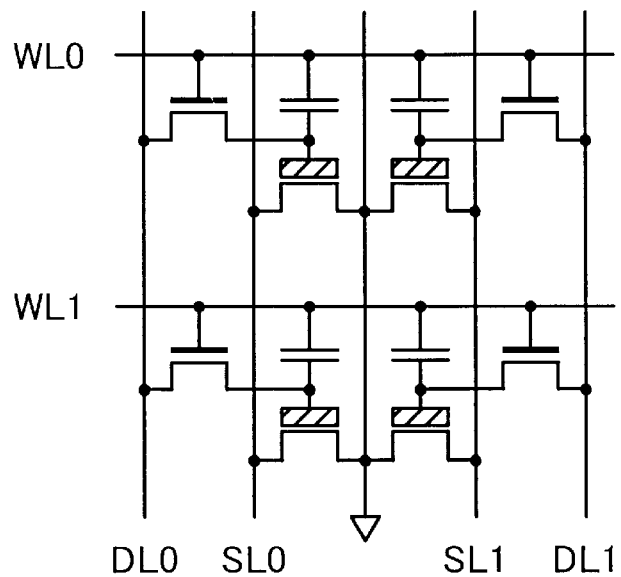
FIG. 5 is a circuit diagram for explaining the first example.

The semiconductor memory device of this invention in which the memory cells are formed into an array and constituted as an integrated circuit is to be explained. FIG. 5 is a circuit diagram showing four memory cells taken out of the array. A matrix is formed with two word lines WL0, WL1 and two write data lines DL0, DL1 and two read data lines SL0 and SL1 in perpendicular relation thereto.

Figure 6:
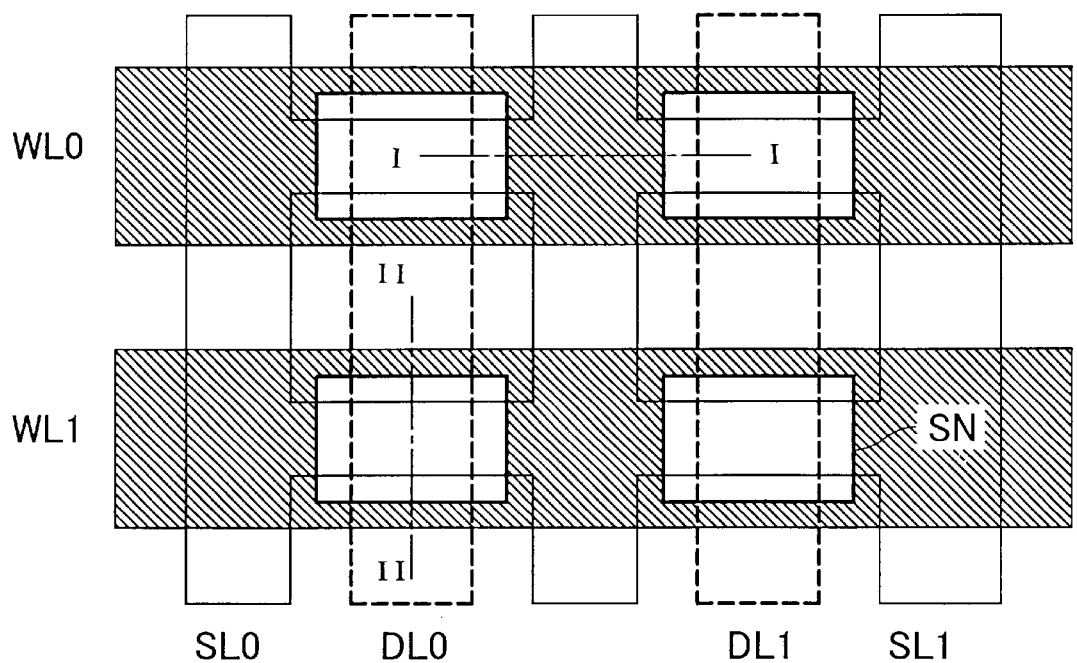
FIG. 6 is an upper plan view for explaining the first example.

FIG. 6 is a plan view of a device for the portion of the four memory cells. The read data line SL0 is disposed on the left and the read data line SL1 is disposed on the right of the source line that extends vertically at the center to form memory cells including portions each opened in a rectangular shape to the word lines WL0 and WL1 between the source line and the read data line SL0 and portions each opened in a rectangular shape to the word lines WL0 and WL1 between the source line and the read data line SL0, respectively. The rectangular shape shown in FIG. 6 shows a portion corresponding to the storage node SN.

Figure 7:
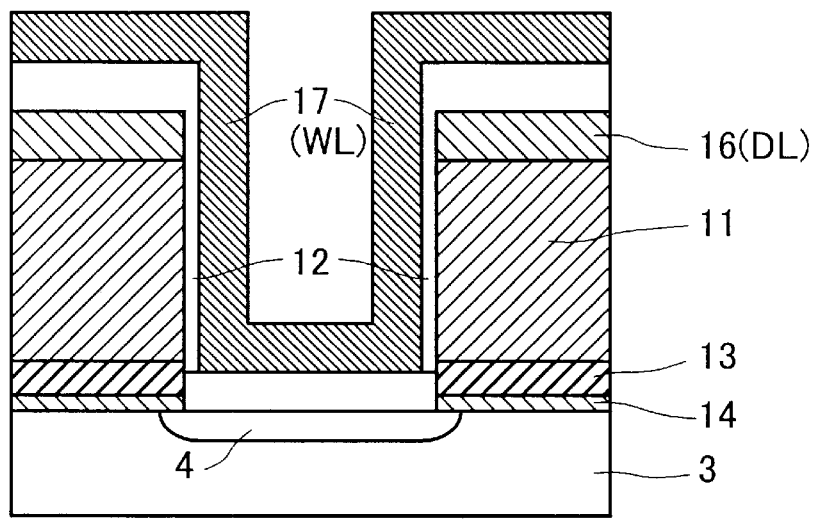
FIG. 7 is a cross sectional view taken along line I—I in FIG. 6.
Figure 8:
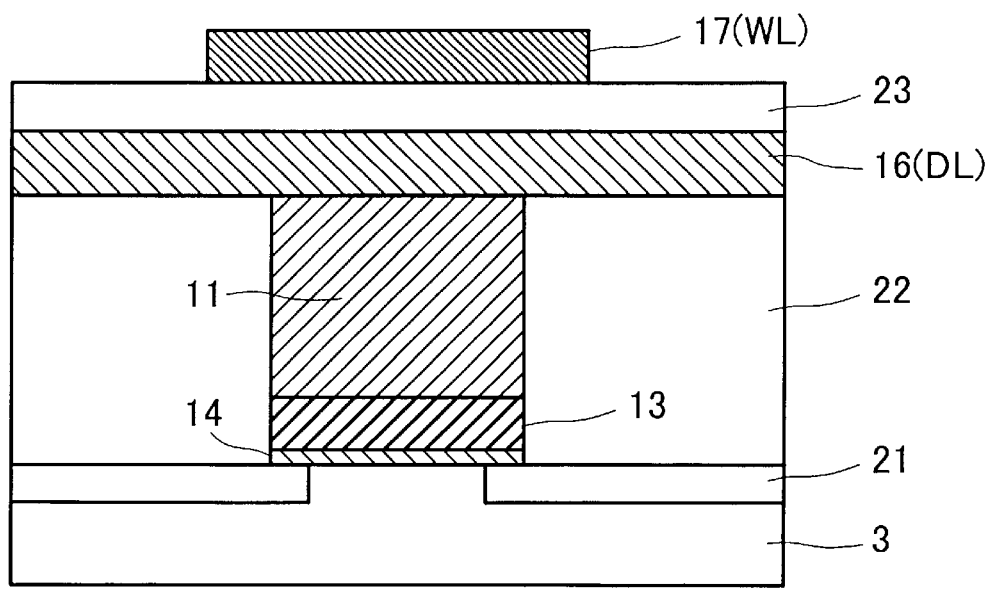
FIG. 8 is a cross sectional view taken along line II—II in FIG. 6.

A cross section of the device along line I—I is shown in FIG. 7 and a cross section of the device along line II—II is shown in FIG. 8. FIG. 7 is a cross sectional view by cutting two memory cells adjacent in the direction of the word line WL, FIG. 8 is a cross section by cutting one cell in the direction of the write data line DL. The $n^+$ diffusion layer in the P-type silicon substrate is used for the read data line SL and doped polysilicon or metal is used for the word line WL and the write data line DL. The word line WL has a form perpendicular to the write data line DL above the data line and extends on the lateral side of the control gate/substrate 11 above the tunneling insulation film 13 at the gap between the write data lines DL with an interval by the insulation film 12, and the control gate/substrate 11 functions as the substrate for the vertical MOS transistor 2. The insulation film 12 and the word line WL function as the gate insulation film and the control gate of the transistor respectively.

As described above, although this example has a constitution comprising two transistors per one cell, since the vertical transistor 2 is stacked on the storage node 15, a high density memory device can be attained.

Example 2

Figure 9:
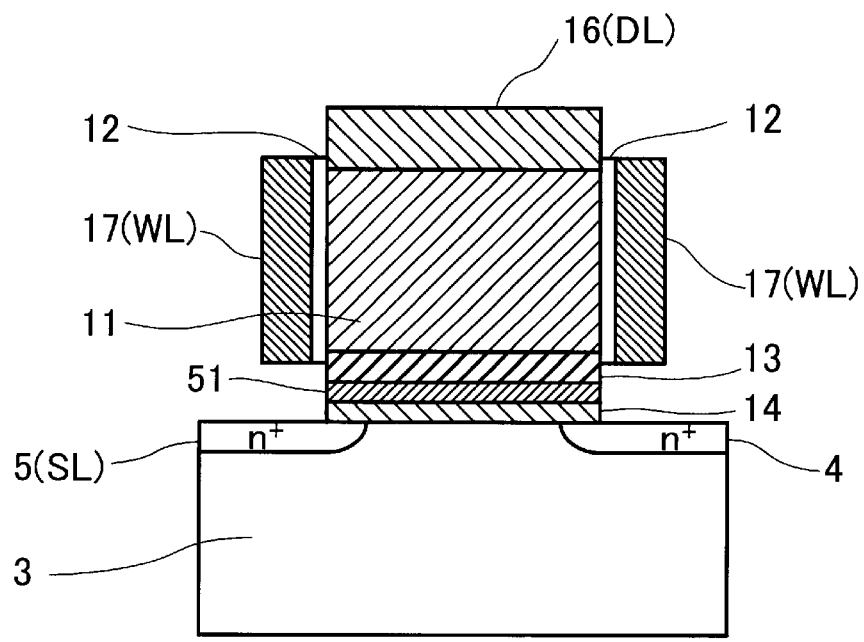
FIG. 9 is a cross sectional view of a memory cell for explaining a second example according to this invention.

FIG. 9 is a cross sectional view for a memory cell of a second example formed by inserting a conductive layer 51 comprising polysilicon between a gate insulation film 14 and a tunneling insulation film 13. In the first,example, since the channel of the transistor 2 is formed along the $SiO_2$ interface of the insulation film 12, charges are injected more in the vicinity of the source at the right side and the drain at the left side of the transistor 1.

In the second example, charges are stored in the conductive layer 51 by injecting the charges from the write data line 16 by way of the channel of the transistor 2 to the conductive layer 51 interposed between the $SiO_2$ film–$Si_3N_4$ film in the direction perpendicular to the substrate. Since the conductive layer 51 is a conductor, injected charges are uniformly distributed in the conductive layer 51 and at an equipotential also in a case where a voltage is applied to the word line. Accordingly, in a case of increasing the length of the channel, the transistor 1 can be ON-OFF controlled effectively. Also in this example, the barrier height of the tunneling insulation film 13 is desirably lower than that of the gate insulation film 14.

Further, for the conductive layer 51, a metal such as tungsten or titanium can also be used in addition to the semiconductor such as polysilicon.

Further, the conductive layer 51 can be constituted also as a floating gate covered with an identical kind of insulation film instead of a structure of being sandwiched between the two kinds of insulation films. Also in this case, the injected charges are uniformly distributed in the floating gate so that the same effect can be obtained. For the floating gate, a metal such as tungsten or titanium can be used instead of polysilicon.

Example 3

For attaining high speed writing at a low voltage, it is one of effective means to lower the barrier height of the tunneling insulation film 13. Meanwhile, the insulation materials that can be used easily in existent silicon semiconductor processes are a silicon oxide film and a nitride film and, although the barrier height cannot be set optionally, a low barrier can be formed by disposing an intermediate layer in the insulation film to introduce a quantum well structure.

Figure 10:
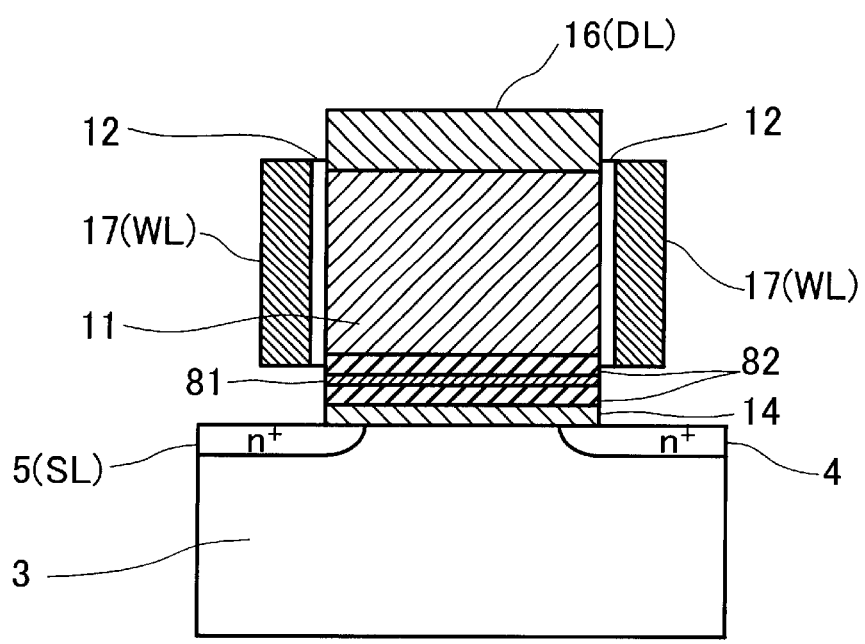
FIG. 10 is a cross sectional view of a memory cell for explaining a third example according to this invention.

This example shown in FIG. 10 is constituted with the view point described above in which a tunneling insulation film is formed as a three layered structure of silicon nitride film 82—silicon layer 81—silicon nitride film 82. For the energy band when the thickness of the silicon layer 81 is set to 1–2 nm, as shown in FIGS. 11A and 11B, the conduction band edge of silicon rises by about 1 eV upon a low electric field applied period and a high electric field applied period thereby enabling the film of the three layered structure to function as a low tunneling barrier. With the constitution described above, the operation speed of the memory device can be increased.

According to this invention, since injection and discharge of charges to and from the storage node are conducted on the side of the control gate, degradation of the oxide film can be suppressed to provide excellent fatigue, as well as obtain a high writing speed. Further, since it includes a controlling MOS transistor of a simple structure by stacking, the size of the memory cell is about equal with that of a one transistor per one cell type and a non-volatile semiconductor memory device having a random access function, of a high density and reduced cost, can be attained.

Industrial Applicability

The semiconductor memory device according to this invention can be utilized generally for various kinds of information equipment, domestic equipment, communication equipment and industrial equipment requiring high speed and high density memory.

What is claimed is:

1. A semiconductor memory device, comprising:
   a first insulation film on a semiconductor substrate;
   a second insulation film on the first insulation film;
   a second MOS (Metal Oxide Semiconductor) transistor in which a channel current flows in the vertical direction to a surface of the second insulation film by being controlled by a word line, and
   a write data line electrode as a write data line;
   wherein the first insulation film, the second insulation film, the second MOS transistor and the write data line electrode are stacked orderly on a channel of a first MOS (Metal Oxide Semiconductor) transistor formed on the semiconductor substrate;
   wherein charges are injected from the write data line by way of a channel of the second MOS transistor into the second insulation film, and the charges are stored in a storage node comprising either charge traps in the second insulation film or an interface between the first insulation film and the second insulation film to thereby hold information and with the information being detected by a change of a current due to a change of a threshold voltage of the first MOS transistor; and
   wherein a charge injection is performed by flows of electrons and holes caused by tunneling between the first MOS transistor which is controlled by a read data line and the second MOS transistor which is controlled by the write data line and the word line.

2. The semiconductor memory device according to claim 1, wherein an electrode of the word line is disposed respectively on both sides of the channel of the second MOS transistor.

3. A semiconductor memory device, comprising:

a first insulation film on a semiconductor substrate;

a conductive layer on the first insulation film;

a second insulation film on the conductive layer;

a second MOS (Metal Oxide Semiconductor) transistor in which a channel current flows in the vertical direction by being controlled by a word line; and a write data line electrode as a write data line;

wherein the first insulation film, the conductive layer, the second insulation film, the second MOS transistor and the write data line electrode are stacked orderly on a channel of a first MOS (Metal Oxide Semiconductor) transistor formed on the semiconductor substrate;

wherein charges are injected from the write data line by way of a channel of the second MOS transistor to the conductive layer in a direction vertical to the semiconductor substrate, with the charges being stored in the conductive layer to thereby hold information and with the information being detected by a change of a current due to a change of a threshold voltage of the first MOS transistor; and wherein a charge injection is performed by flows of electrons and holes caused by tunneling between the first MOS transistor which is controlled by a read data line and the second MOS transistor which is controlled by the write data line and the word line.

4. The semiconductor memory device according to claim 1, wherein a barrier height of the second insulation film is lower than a barrier height of the first insulation film.

5. The semiconductor memory device according to claim 2, wherein a barrier height of the second insulation film is lower than a barrier height of the first insulation film.

6. The semiconductor memory device according to claim 3, wherein a barrier height of the second insulation film is lower than a barrier height of the first insulation film.

7. A semiconductor memory device, comprising:

a first insulation film on a semiconductor substrate;

a second insulation film on the first insulation film;

a second MOS (Metal Oxide Semiconductor) transistor in which a channel current flows in the vertical direction by being controlled by a word line; and a write data line electrode as a write data line;

wherein the first insulation film, the second insulation film, the second MOS transistor and the write data line electrode are stacked orderly on a channel of a first MOS (Metal Oxide Semiconductor) transistor formed on the semiconductor substrate;

wherein charges are injected from the write data line by way of a channel of the second MOS transistor to the second insulation film in a direction vertical to the semiconductor substrate, with the charges being trapped and stored in the second insulation film to thereby hold information and with the information being detected by a change of a current due to a change of a threshold voltage of the first MOS transistor; and wherein a charge injection is performed by flows of electrons and holes caused by tunneling between the first MOS transistor which is controlled by a read data line and the second MOS transistor which is controlled by the write data line and the word line.

8. The semiconductor memory device according to claim 7, wherein a barrier height of the second insulation film is lower than a barrier height of the first insulation film.

* * * * *